(12) United States Patent
Chou

(10) Patent No.: US 8,757,963 B2
(45) Date of Patent: Jun. 24, 2014

(54) THERMAL MODULE WITH AIRFLOW GUIDING FUNCTION

(71) Applicant: Wistron Corporation, New Taipei (TW)

(72) Inventor: Wei-Cheng Chou, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 13/794,818

(22) Filed: Mar. 12, 2013

(65) Prior Publication Data
US 2013/0186603 A1    Jul. 25, 2013

Related U.S. Application Data

(62) Division of application No. 12/638,989, filed on Dec. 16, 2009, now Pat. No. 8,439,632.

(30) Foreign Application Priority Data

Jan. 23, 2009 (TW) .............................. 98201537 U

(51) Int. Cl.
*F03D 11/00* (2006.01)
*F01D 25/24* (2006.01)
*F04D 29/44* (2006.01)
*F04D 29/54* (2006.01)

(52) U.S. Cl.
USPC .......................................... 415/127; 415/196

(58) Field of Classification Search
USPC ............... 415/126, 127, 128, 121.2, 196, 204
See application file for complete search history.

(56) References Cited

U.S. PATENT DOCUMENTS

| | | | |
|---|---|---|---|
| 2,290,423 A | 7/1942 | Funk | |
| 5,551,836 A * | 9/1996 | Roth et al. | 415/204 |
| 6,254,343 B1 | 7/2001 | Schmidt | |
| 6,549,406 B1 * | 4/2003 | Olesiewicz et al. | 361/695 |
| 7,195,450 B2 | 3/2007 | Takamatsu | |
| 7,228,889 B1 * | 6/2007 | Tian et al. | 165/122 |
| 2006/0067820 A1 * | 3/2006 | Wang et al. | 415/220 |
| 2006/0078427 A1 | 4/2006 | Hsieh | |
| 2006/0275115 A1 * | 12/2006 | Wu et al. | 415/206 |
| 2007/0154300 A1 * | 7/2007 | Liang | 415/119 |

* cited by examiner

*Primary Examiner* — Ned Landrum
*Assistant Examiner* — Su Htay
(74) *Attorney, Agent, or Firm* — Winston Hsu; Scott Margo

(57) ABSTRACT

A thermal module includes a fan device having a fan and a fan housing for covering the fan. A vent is disposed on the fan housing. The thermal module further includes an airflow guiding device installed on the fan housing in a protrudable manner and disposed on a side of the vent for guiding airflow into the vent.

7 Claims, 15 Drawing Sheets

THERMAL MODULE WITH AIRFLOW GUIDING FUNCTION

CROSS REFERENCE TO RELATED APPLICATIONS

This application is a division of application Ser. No. 12/638,989 filed on Dec. 16, 2009, and the entire contents of which are hereby incorporated by reference.

BACKGROUND OF THE INVENTION

1. Field of the Invention

The present invention relates to a thermal module, and more particularly, to a thermal module with airflow guiding function.

2. Description of the Prior Art

Consumer electronic products have more and more functions with progress of technology. Hence the demand for performance increases accordingly. The high performance brings high energy consumption resulting in resonance, noise, thermal problems, and so on. For example, the reliability and stability of electronic products reduce if heat generated by internal electronic components can not be dissipated effectively. The conventional solution of thermal problem is utilizing a thermal system, such as a fan, a heat sink, a heat pipe, or a cooling chip for reducing temperature of the electronic components so that the electronic products can operate normally.

For instance, heat transmitted from electronic components on the mother board to a housing made of plastic or metal material, so that a palm rest on a notebook computer often has high temperature causing uncomfortable feeling of a user. However, the thermal module, such as thermal fins and the heat pipe, can not be disposed in a small gap between the mother board and the housing. For solving this problem, the temperature of the heat source can be reduced by airflow passing therethrough. For example, a guiding channel formed by sponge or plastic baffle for guiding airflow from the fan to the heat source can dissipate hot air around the heat source. However there is no airflow guiding structure applied for the fan, and the fan inhales surrounding cold air at lower flow resistance more easily than the hot air passing through the guiding channel in the system. It is disadvantageous to reduce surface temperature of the palm rest due to poor heat-dissipating efficiency.

SUMMARY OF THE INVENTION

The present invention discloses a thermal module including a fan device having a fan and a fan housing for covering the fan. A vent is disposed on the fan housing. The thermal module further includes an airflow guiding device installed on the fan housing in a protrudable manner and disposed on a side of the vent for guiding airflow into the vent.

According to the claimed invention, the airflow guiding device is an arc structure.

According to the claimed invention, a slot is formed on the fan housing, and the airflow guiding device includes a protruding component installed inside the slot in a protrudable manner, and at least one elastic component connected to the protruding component for providing elastic force to the protruding component.

According to the claimed invention, at least one positioning hole is formed on a side of the slot, and a positioning component is disposed on the protruding component corresponding to the positioning hole for inserting into the positioning hole so as to fix the protruding component in the slot.

According to the claimed invention, at least one pin is formed on the slot, at least one pillar is disposed on the protruding component corresponding to the pin, and the elastic component sheathes the pin and is installed inside the pillar.

According to the claimed invention, the slot is an arc slot and the protruding component is an arc structure.

According to the claimed invention, the elastic component is a spring.

According to the claimed invention, the thermal module further includes an elastic pad installed on a side of the airflow guiding device.

According to the claimed invention, the elastic pad is made of rubber material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
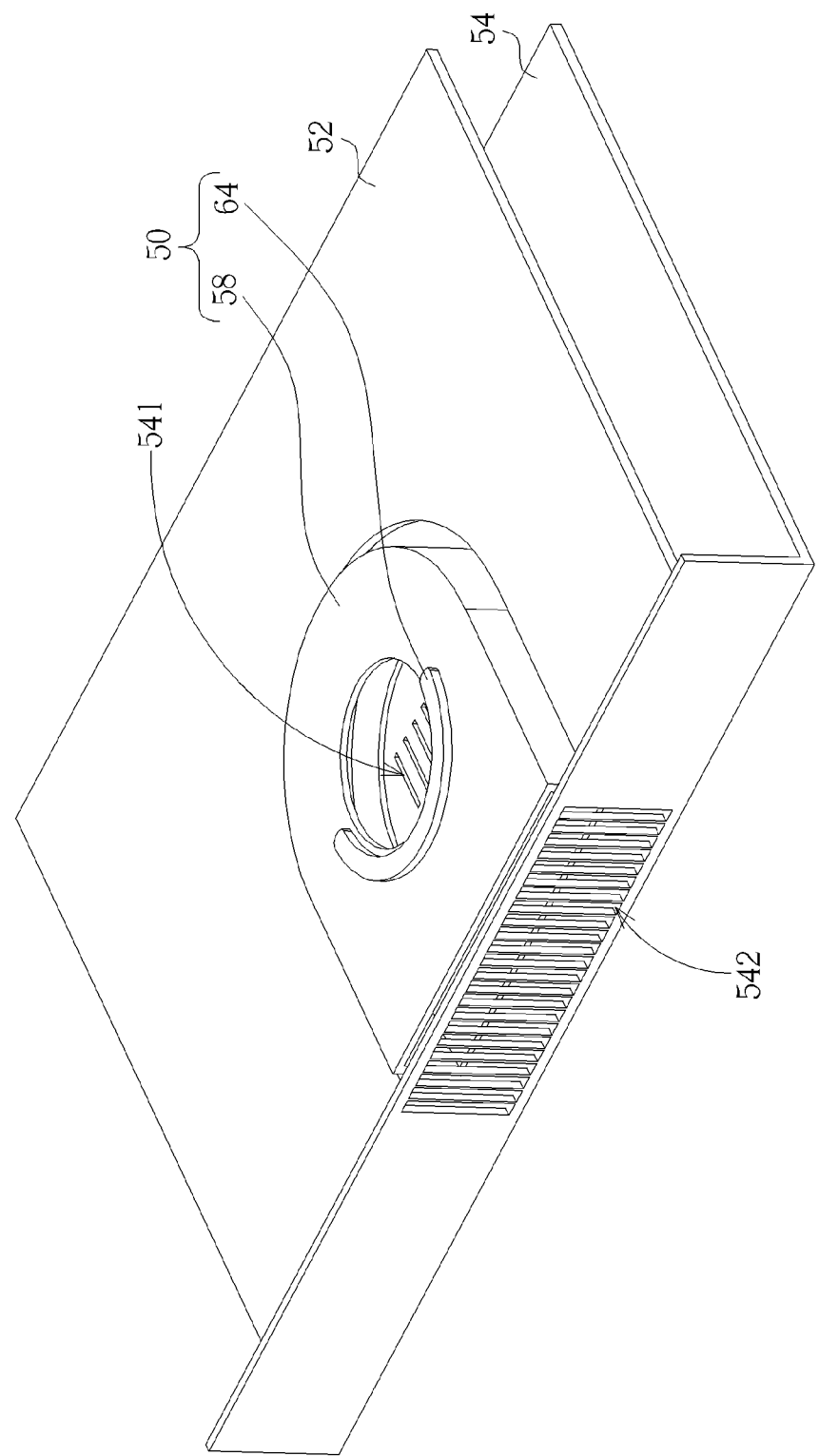
FIG. 1 is a perspective drawing of a thermal module installed inside a housing according to a first embodiment of the present invention.

Please refer to FIG. 1 to FIG. 4. FIG. 1 is a perspective drawing of a thermal module 50 installed inside a housing according to a first embodiment of the present invention. FIG.

Figure 2:
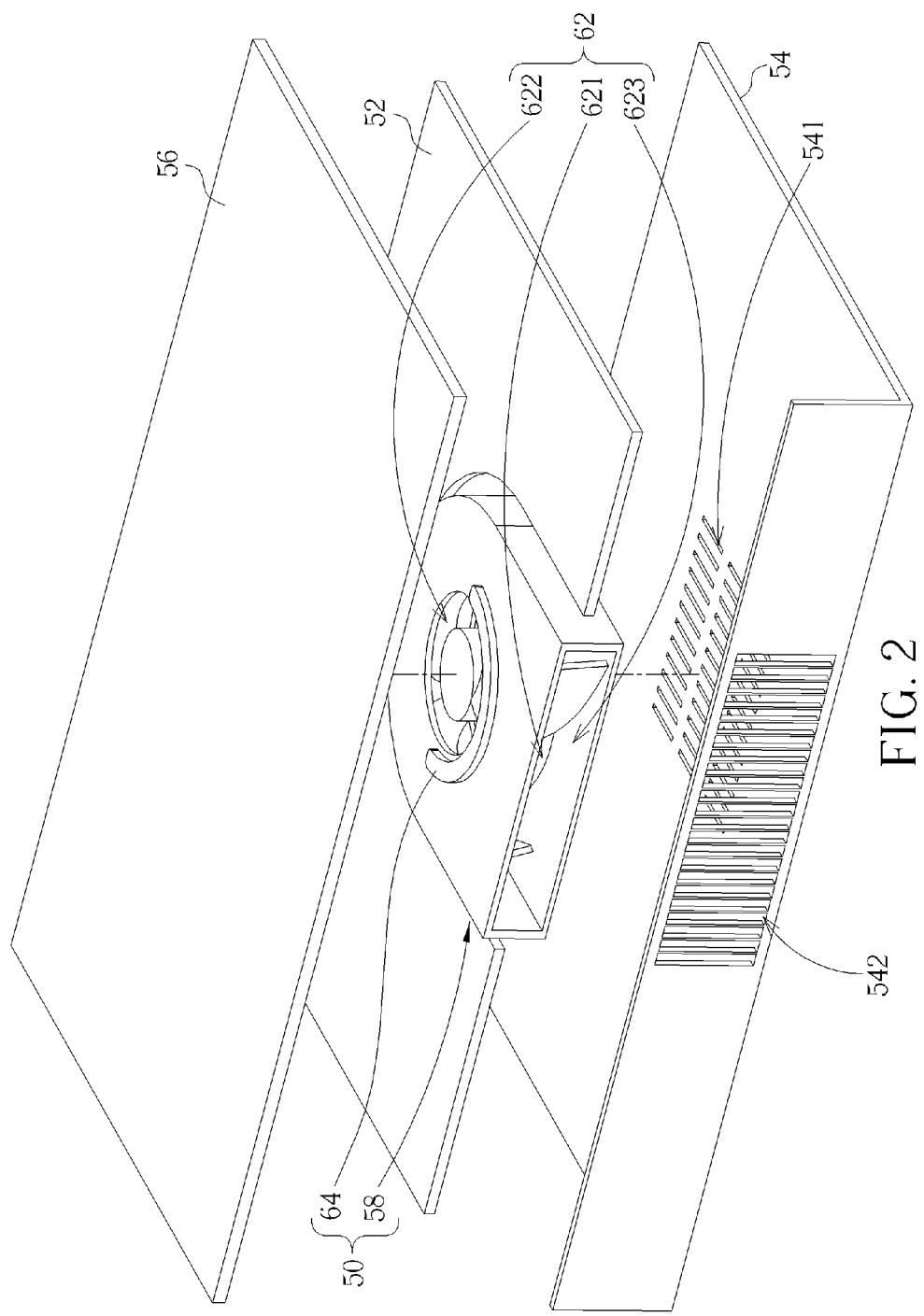
FIG. 2 is an exploded diagram of the thermal module installed inside the housing according to the first embodiment of the present invention.
Figure 3:
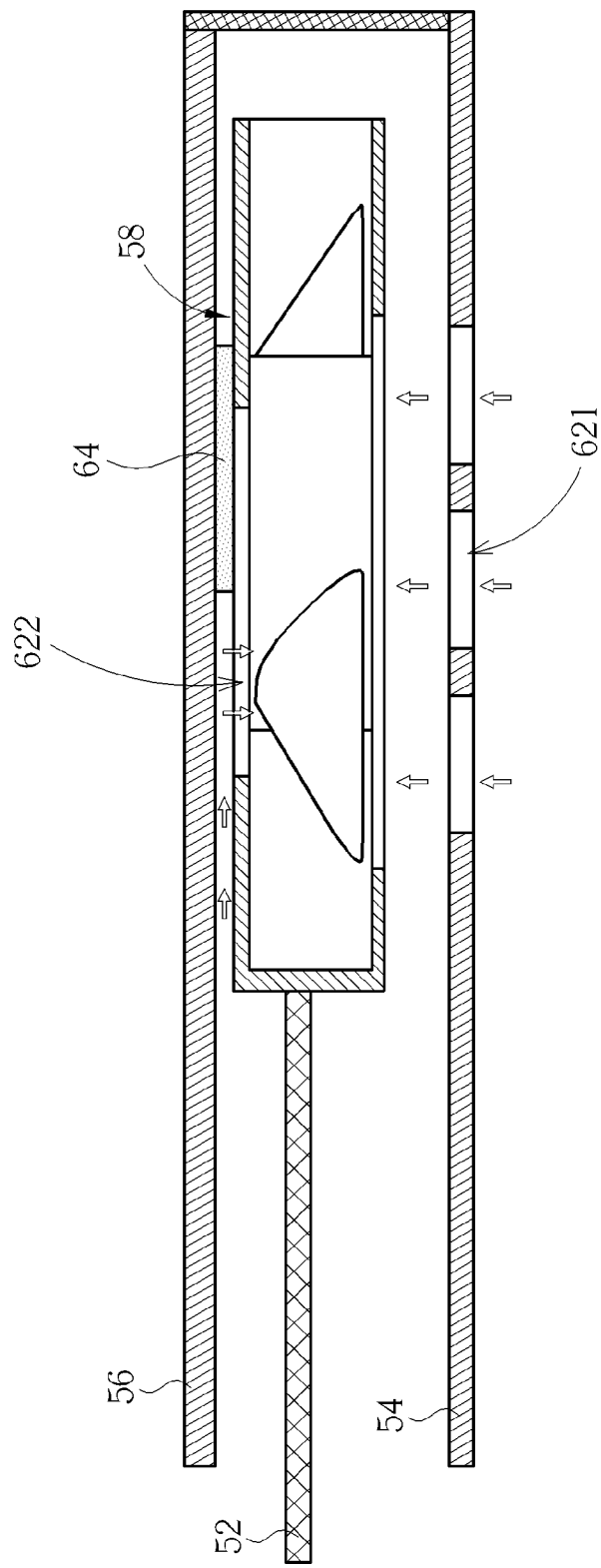
FIG. 3 is a sectional view of the thermal module installed inside the housing according to the first embodiment of the present invention.
Figure 4:
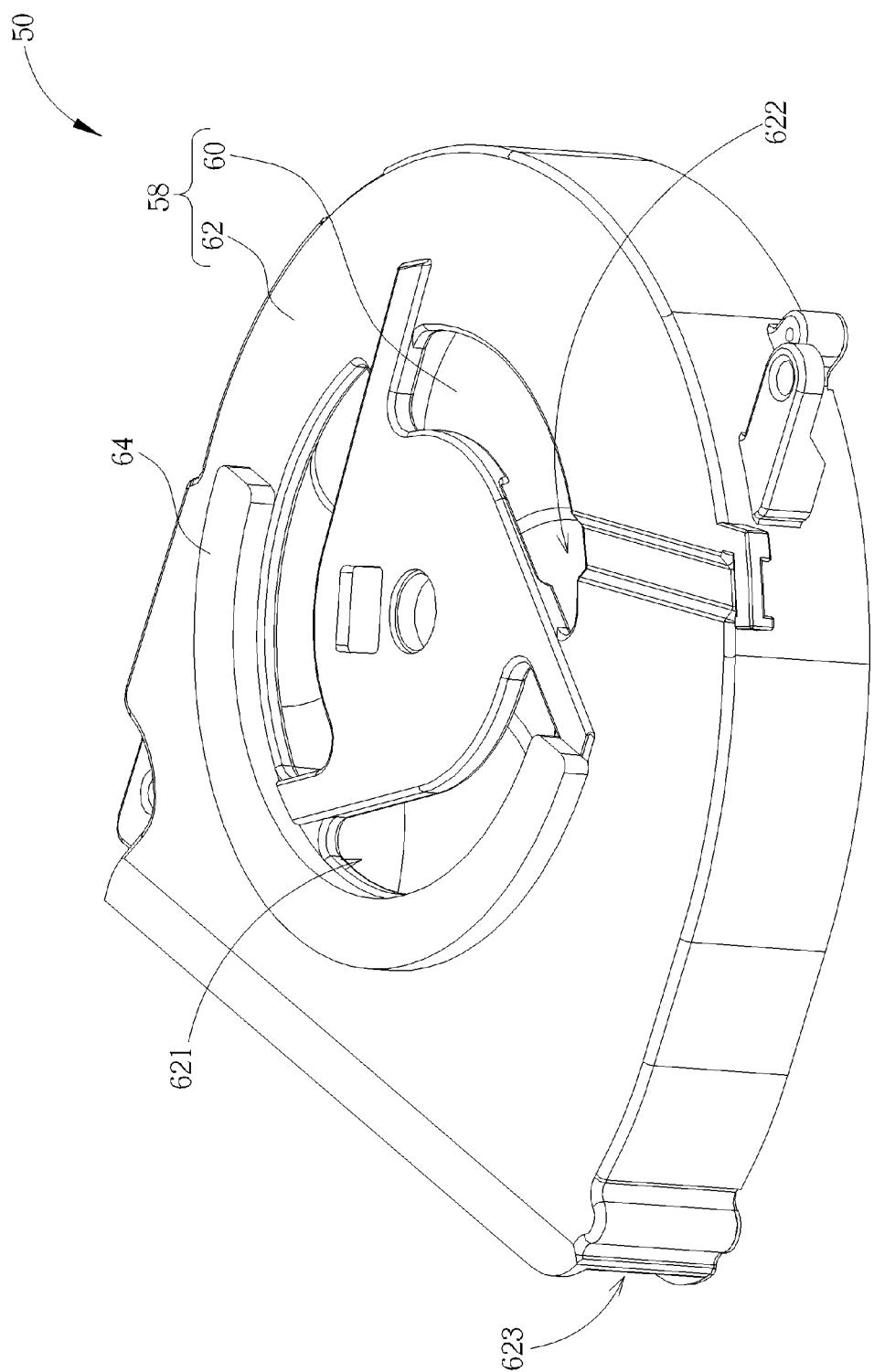
FIG. 4 is a diagram of the thermal module according to the first embodiment of the present invention.

2 is an exploded diagram of the thermal module 50 installed inside the housing according to the first embodiment of the present invention. FIG. 3 is a sectional view of the thermal module 50 installed inside the housing according to the first embodiment of the present invention. FIG. 4 is a diagram of the thermal module 50 according to the first embodiment of the present invention. The thermal module 50 can be installed inside a computer system, such as a notebook computer, and fixed on a substrate 52 which can be a thermal conductive substrate or a circuit board. The substrate 52 can be disposed selectively. The thermal module 50 is installed between a first casing 54 and a second casing 56. The first casing 54 and the second casing 56 cover internal components together. For example, the first casing 54 can be a bottom casing, and the second casing 56 can be an upper casing. A first opening 541 and a second opening 542 are disposed on the first casing 54. The thermal module 50 inhales cold air via the first opening 541 and exhausts hot air via the second opening 542. For showing the disposition of the thermal module 50, the first opening 541, and the second opening 542 clearly, the second casing 56 is omitted to display in FIG. 1. As shown in FIG. 2, the thermal module 50 includes a fan device 58 for inhaling the cold air via the first opening 541 and exhausts the hot air via the second opening 542. The fan device 58 includes a fan 60 and a fan housing 62 for covering the fan 60. A first vent 621, a second vent 622, and an outlet 623 are disposed on the fan housing 62. The fan 60 inhales the cold air via the first vent 621 and the second vent 622 and exhausts the hot air via the outlet 623. The first vent 621 is located in a position corresponding to the first opening 541 on the first casing 54. Most airflow enters into the fan 60 via the first opening 541 on the first casing 54 with higher porosity and the first vent 621 perpendicularly. The second vent 622 often faces the motherboard or the upper casing with lower porosity so that airflow has to enter into the fan 60 through a gap between the fan device 58 and the second casing 56. Furthermore, the fan device 58 can be connected to other heat-dissipating components, such as a heat pipe or thermal fins, for dissipating heat transmitted from the other heat-dissipating components with forced convection method.

The thermal module 50 further includes an airflow guiding device 64 installed on the fan housing 62 and disposed on a side of the first vent 621 for guiding airflow into the first vent 621. In this embodiment, the airflow guiding device 64 can be an arc structure and a baffle. The airflow guiding device 64 can be integrated with the fan housing 62 monolithically or be glued to the fan housing 62. The airflow guiding device 64 can be made of plastic, sponge, or metal material. As shown in FIG. 3, when the airflow enters the second vent 622 through the gap around the second vent 622, the airflow guiding device 64 can guide the airflow around the fan device 58, that is, the airflow guiding device 64 can block the airflow passing through the second vent 622 laterally so as to guide the airflow to flow downward into the second vent 622. Furthermore, the airflow guiding device 64 can increase the gap of airflow inhalation for preventing other objects from contacting with the fan device 58 directly so as to reduce the gap of airflow inhalation. The airflow can be guided to flow into the second vent 622 in a predetermined direction by disposition of the airflow guiding device 64. For example, the airflow guiding device 64 can be orientated to face the heat source with high temperature so that the airflow guiding device 64 can guide the hot airflow from the heat source with high temperature into the second vent 622 for increasing heat-dissipating efficiency. The airflow guiding device 64 also can be disposed to guide the airflow to flow through electronic components with heat below the palm rest first and then enter into the fan device 58 so as to reduce the temperature of the palm rest and provide comfortable feeling for the user. The arc structure of the airflow guiding device 64 can be oriented according to disposition of the heat source and cooperates with conventional airflow guiding mechanism together for dissipating heat outside smoothly.

Figure 5:
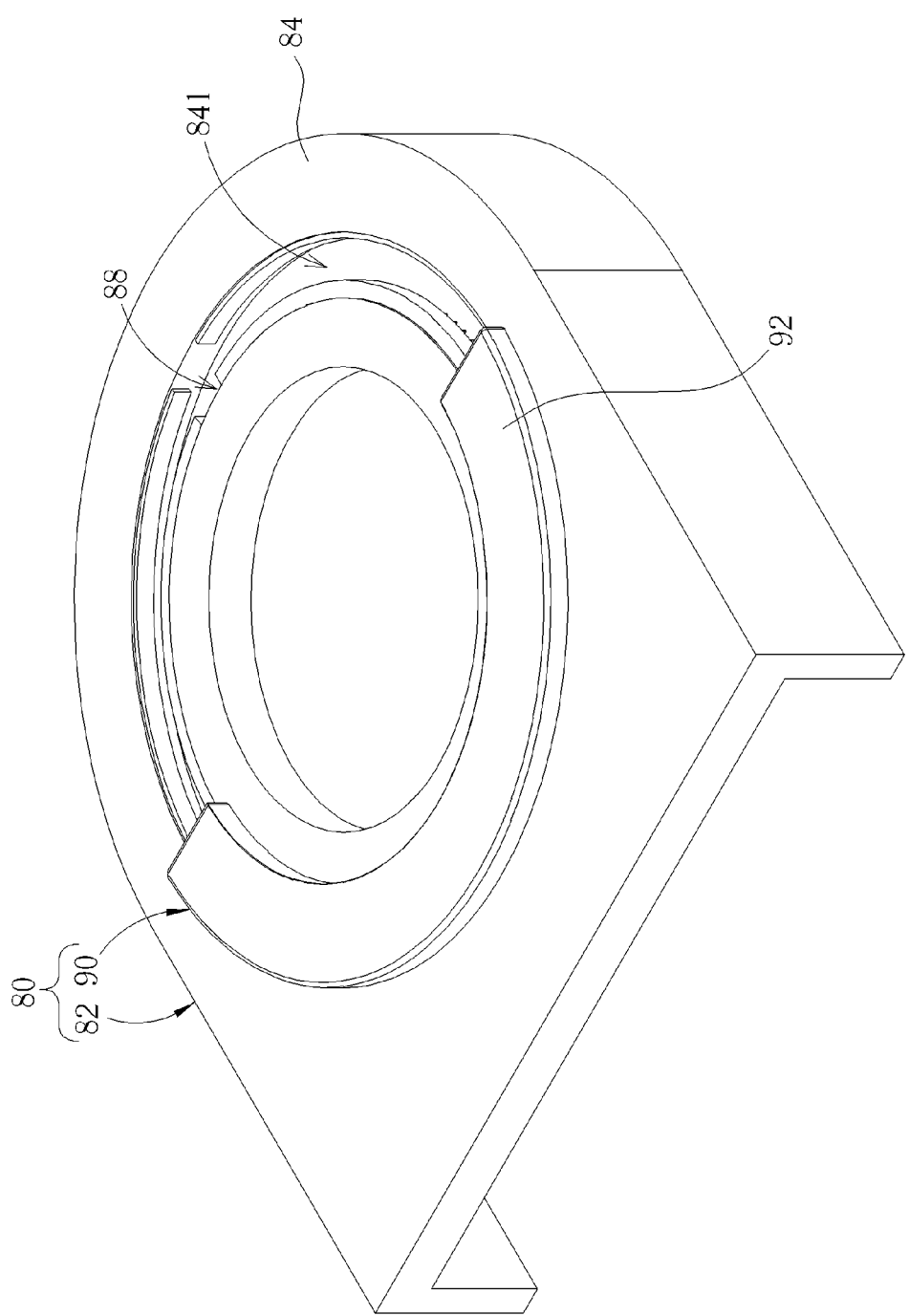
FIG. 5 is a perspective drawing of a thermal module according to a second embodiment of the present invention.
Figure 6:
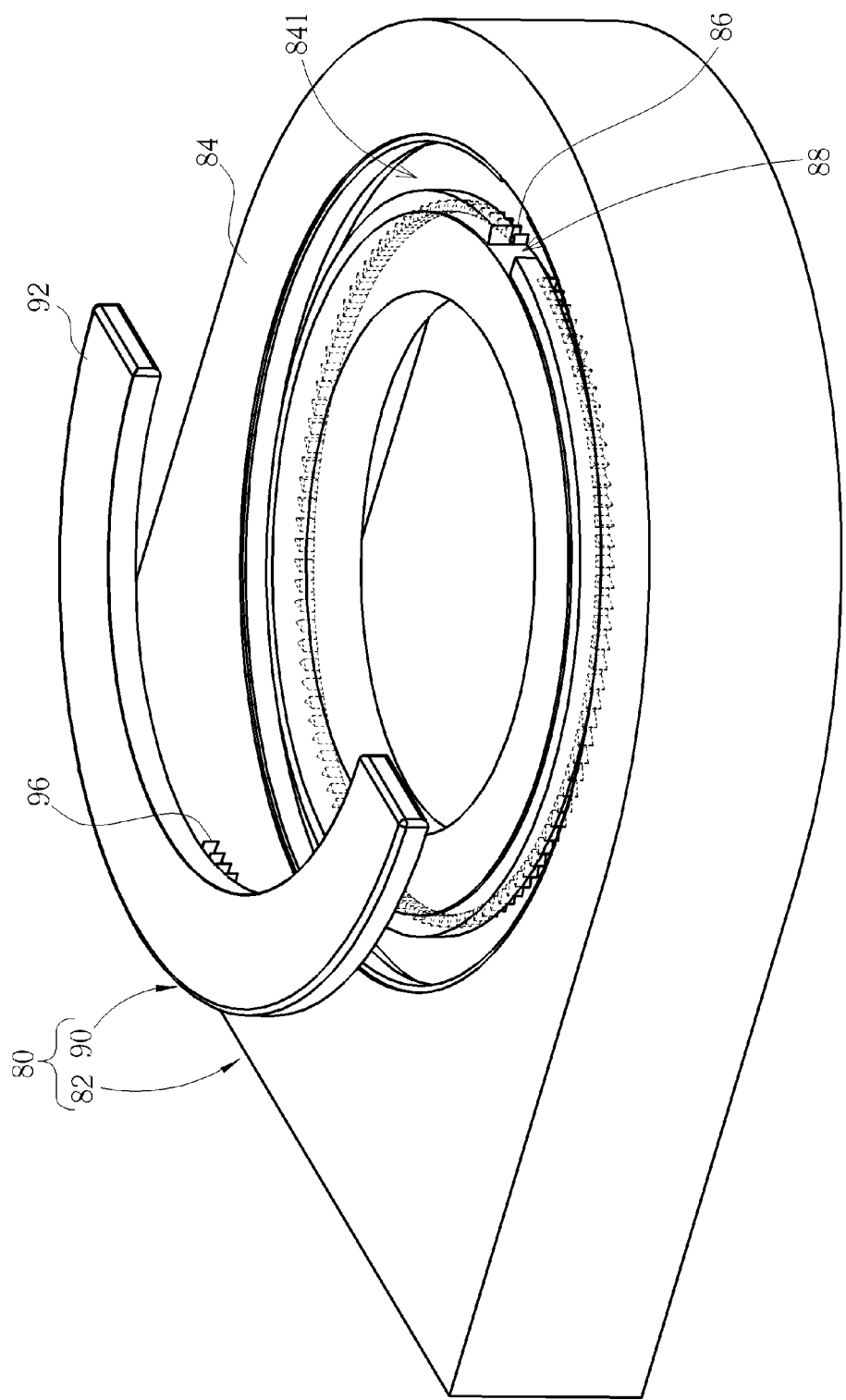
FIG. 6 is an exploded diagram of the thermal module according to the second embodiment of the present invention.
Figure 7:
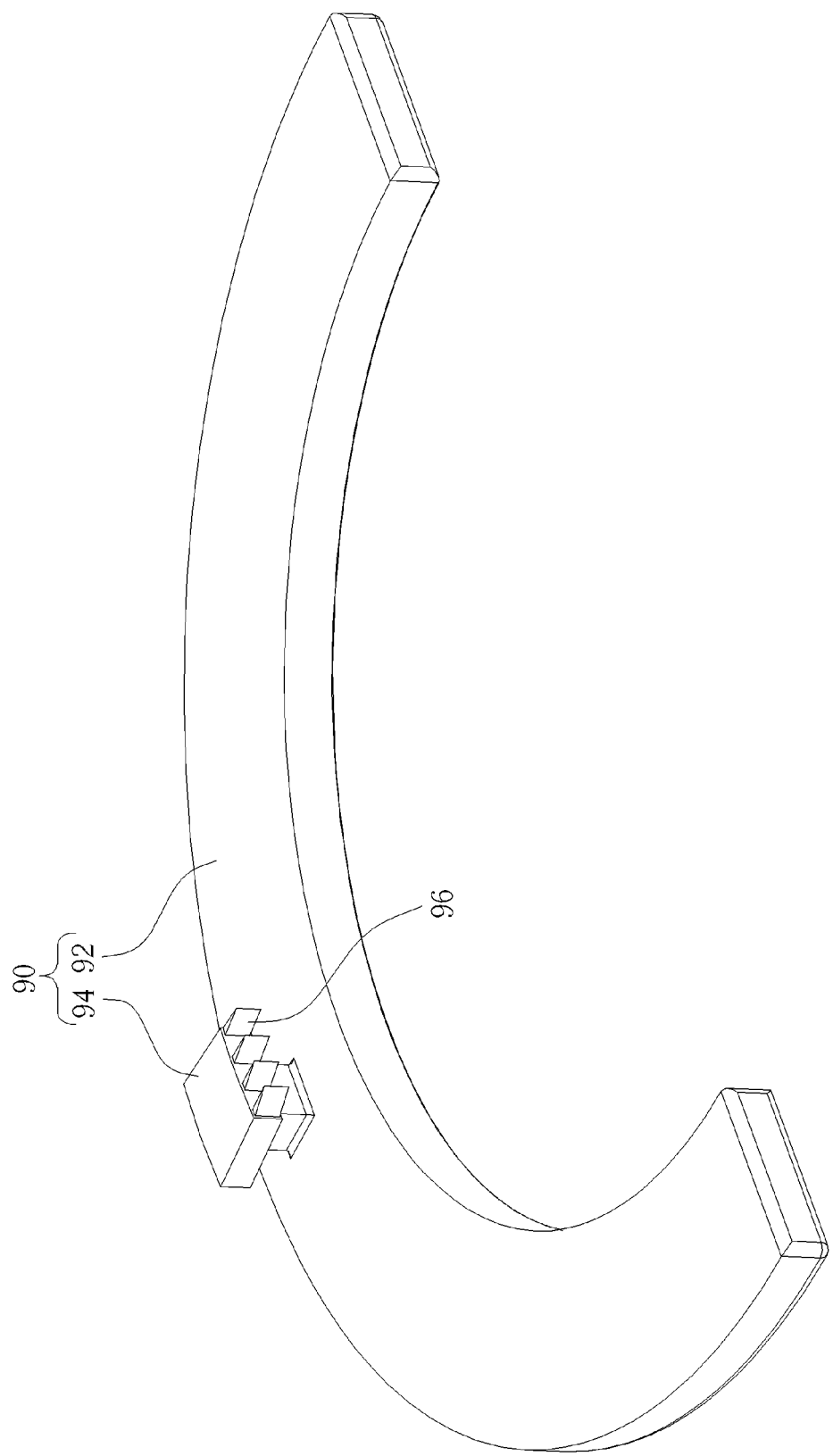
FIG. 7 is a diagram of the airflow guiding device according to the second embodiment of the present invention.

Please refer FIG. 5 and FIG. 6. FIG. 5 is a perspective drawing of a thermal module 80 according to a second embodiment of the present invention. FIG. 6 is an exploded diagram of the thermal module 80 according to the second embodiment of the present invention. The thermal module 80 includes a fan device 82 having a fan housing 84 for covering a fan, which is not shown in figures for displaying other components clearly. A groove 841 is formed on the fan housing 84, and the groove 841 can be an arc groove. A first ratchet structure 86 is disposed on a side of the groove 841, and an opening 88 is disposed within the first ratchet structure 86. The thermal module 80 further includes an airflow guiding device 90. The difference between the first embodiment and the second embodiment is that the airflow guiding device 90 is installed on the fan housing 84 in a slidable manner for adjusting inhaling direction of the fan device 82 conveniently. Please refer to FIG. 5 to FIG. 7. FIG. 7 is a diagram of the airflow guiding device 90 according to the second embodiment of the present invention. The airflow guiding device 90 includes a sliding component 92 installed inside the groove 841 in a slidable manner. The sliding component 92 can be an arc structure and a baffle. The airflow guiding device 90 further includes a fixing component 94 connected to the sliding component 92 for fixing the sliding component 92 inside the groove 841. A second ratchet structure 96 is disposed on the fixing component 94 for engaging with the first ratchet structure 86. For assembling the airflow guiding device 90 on the fan housing 84, the fixing component 94 is aimed at the opening 88 first so that the fixing component 94 can pass through the opening 88 for disposing the sliding component 92 inside the groove 841. The engagement of the first ratchet structure 86 and the second ratchet structure 96 can fix the sliding component 92 inside the groove 841 tightly. The sliding component 92 can rotate in the groove 841 to orientate at a specific angle. The principle of guiding airflow of the second embodiment is the same as the one of the first embodiment, and the detailed description is omitted herein.

Figure 8:
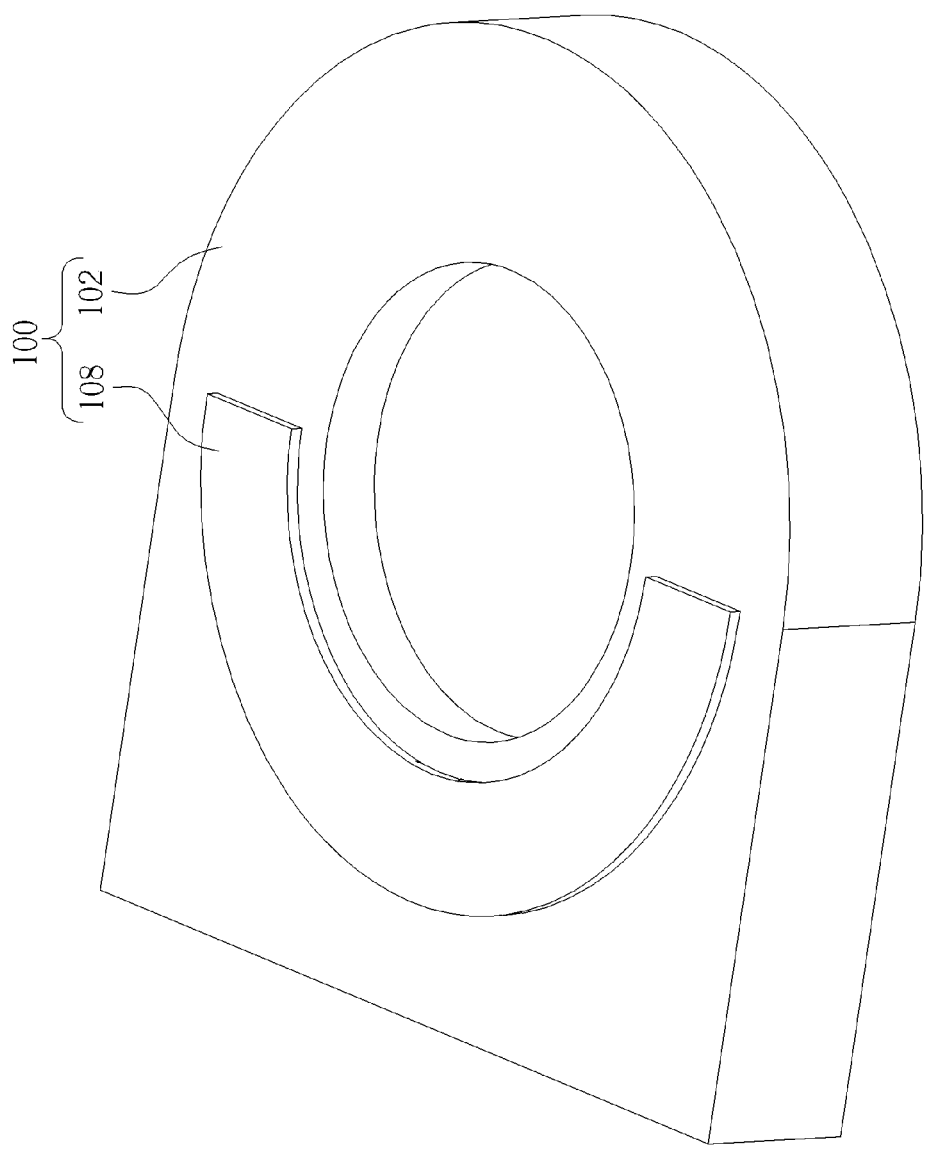
FIG. 8 is a diagram of a thermal module in a guiding condition according to a third embodiment of the present invention.
Figure 9:
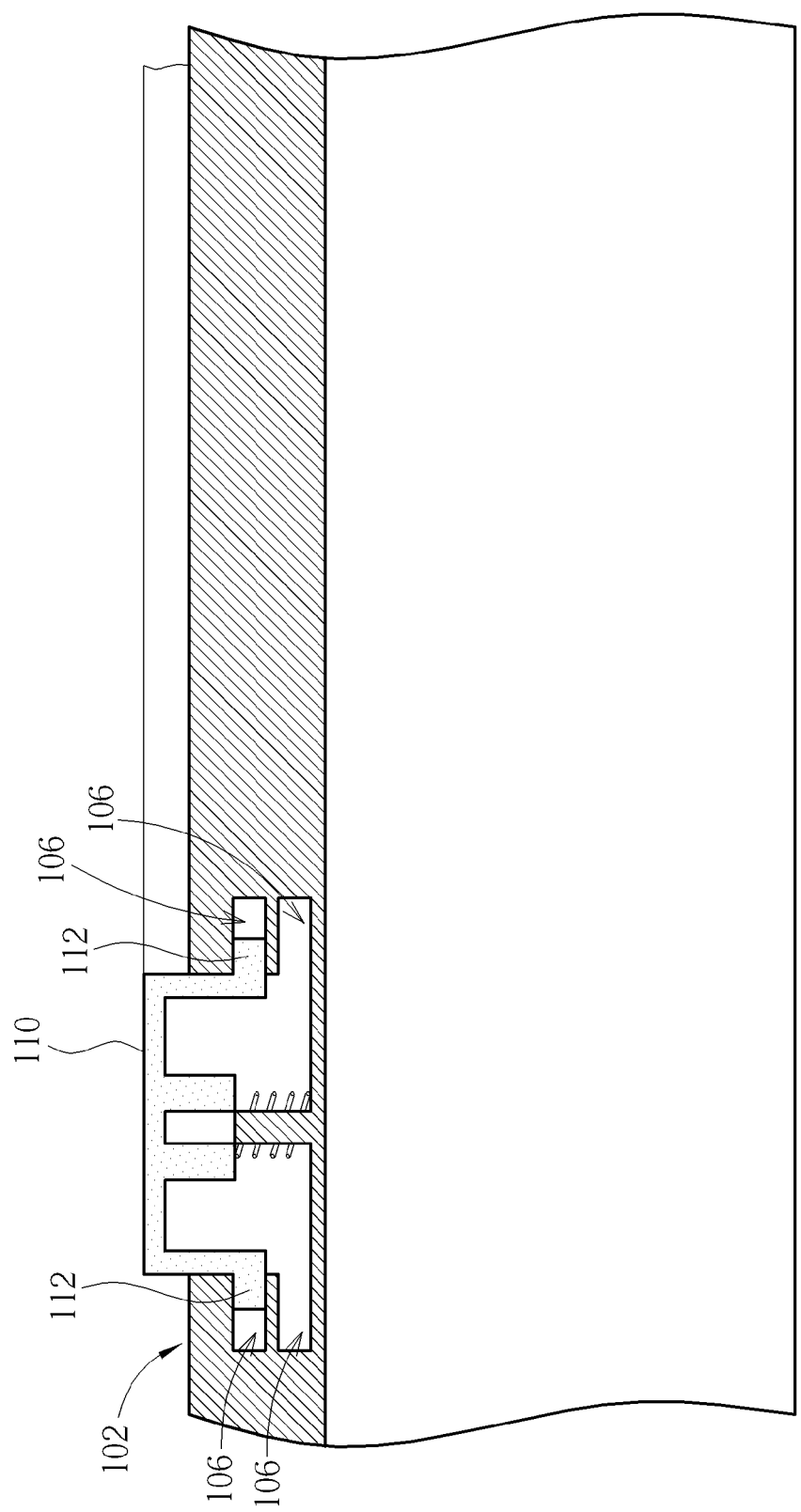
FIG. 9 is a sectional view of the thermal module in the guiding condition according to the third embodiment of the present invention.
Figure 10:
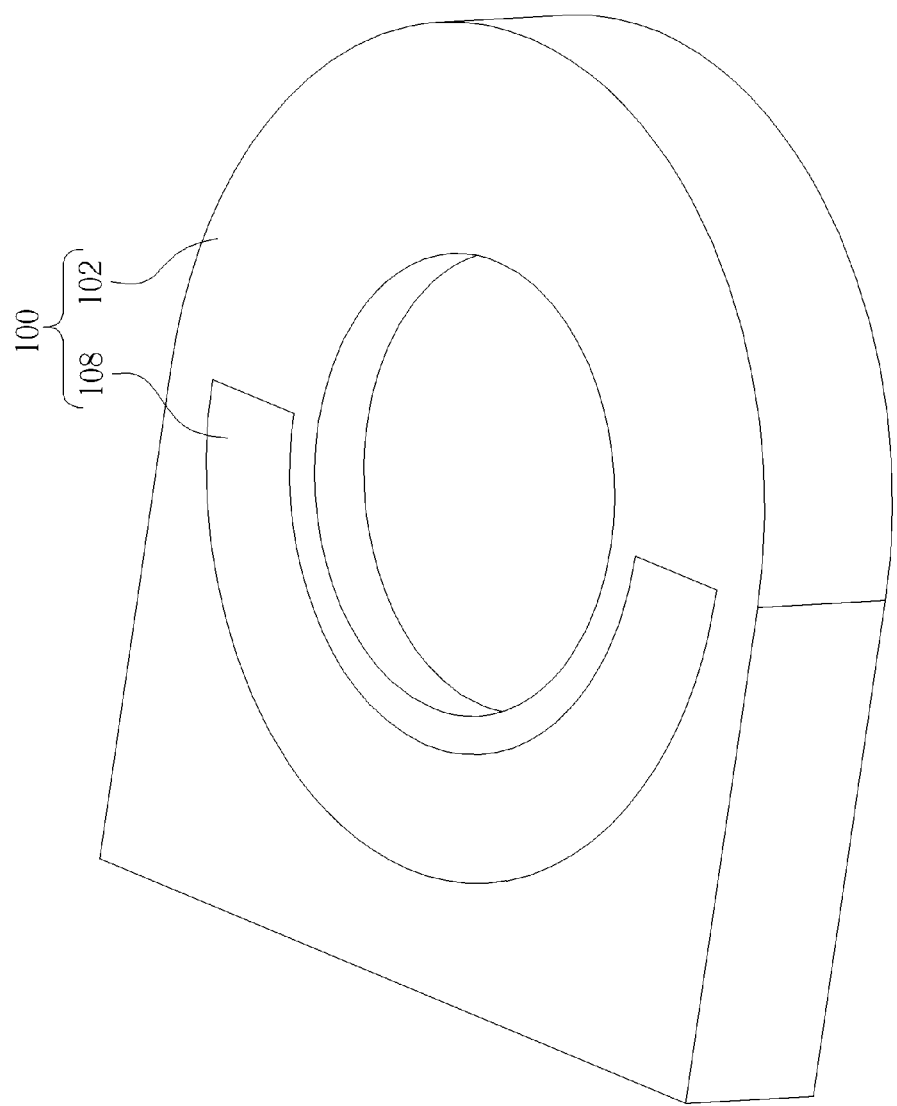
FIG. 10 is a diagram of the thermal module in a non-guiding condition according to the third embodiment of the present invention.
Figure 11:
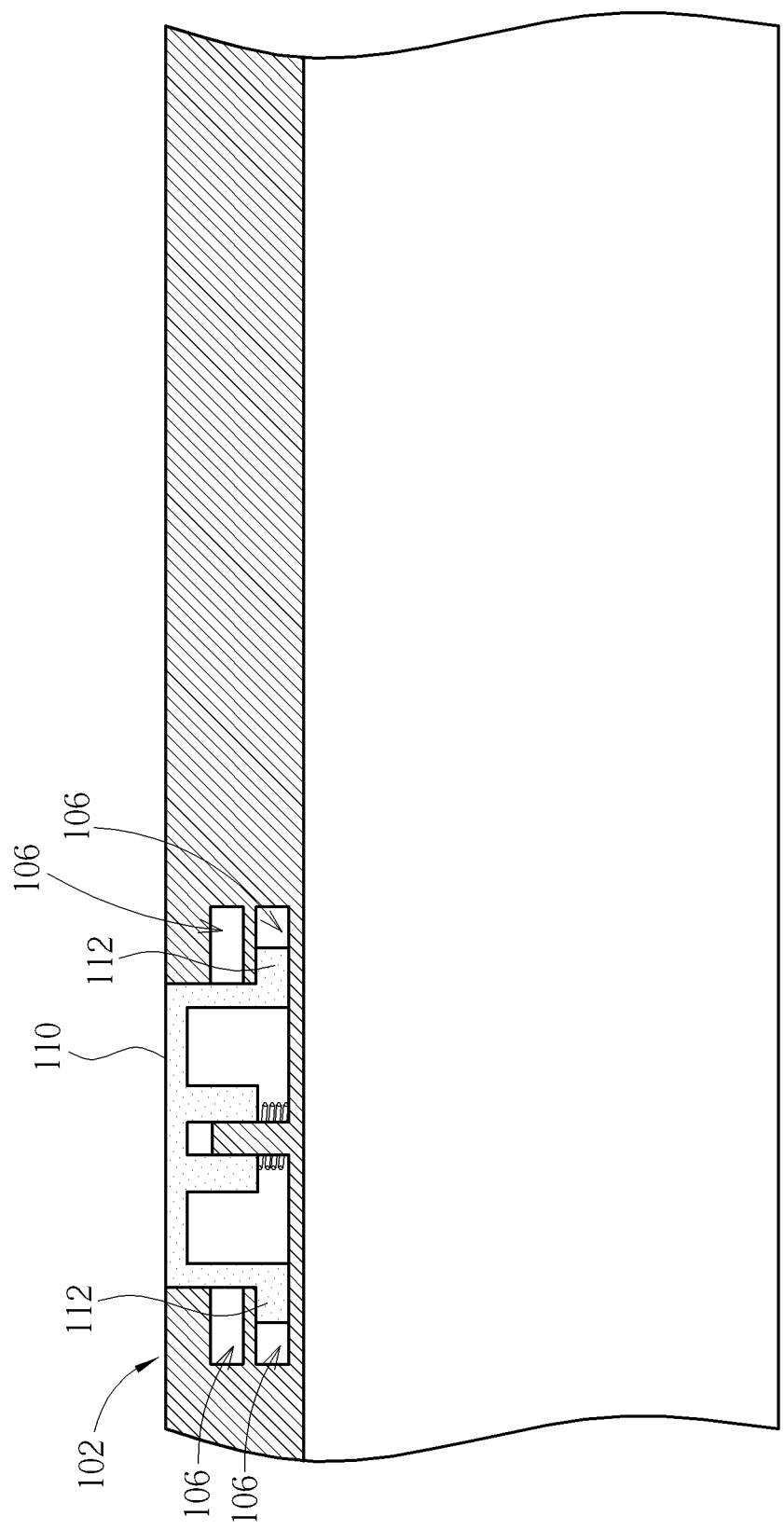
FIG. 11 is a sectional view of the thermal module in the non-guiding condition according to the third embodiment of the present invention.
Figure 12:
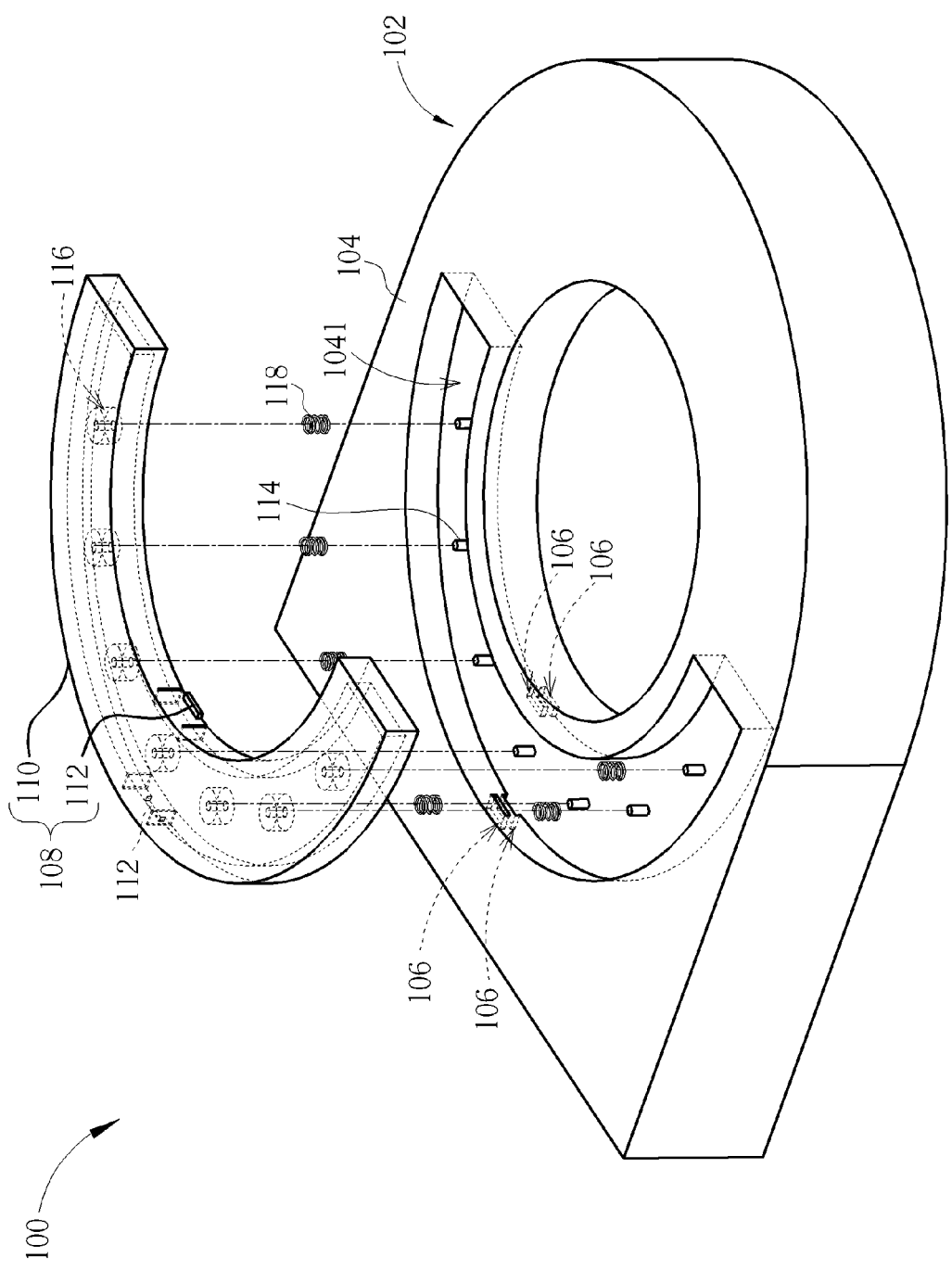
FIG. 12 is an exploded drawing of the thermal module according to the third embodiment of the present invention.
Figure 13:
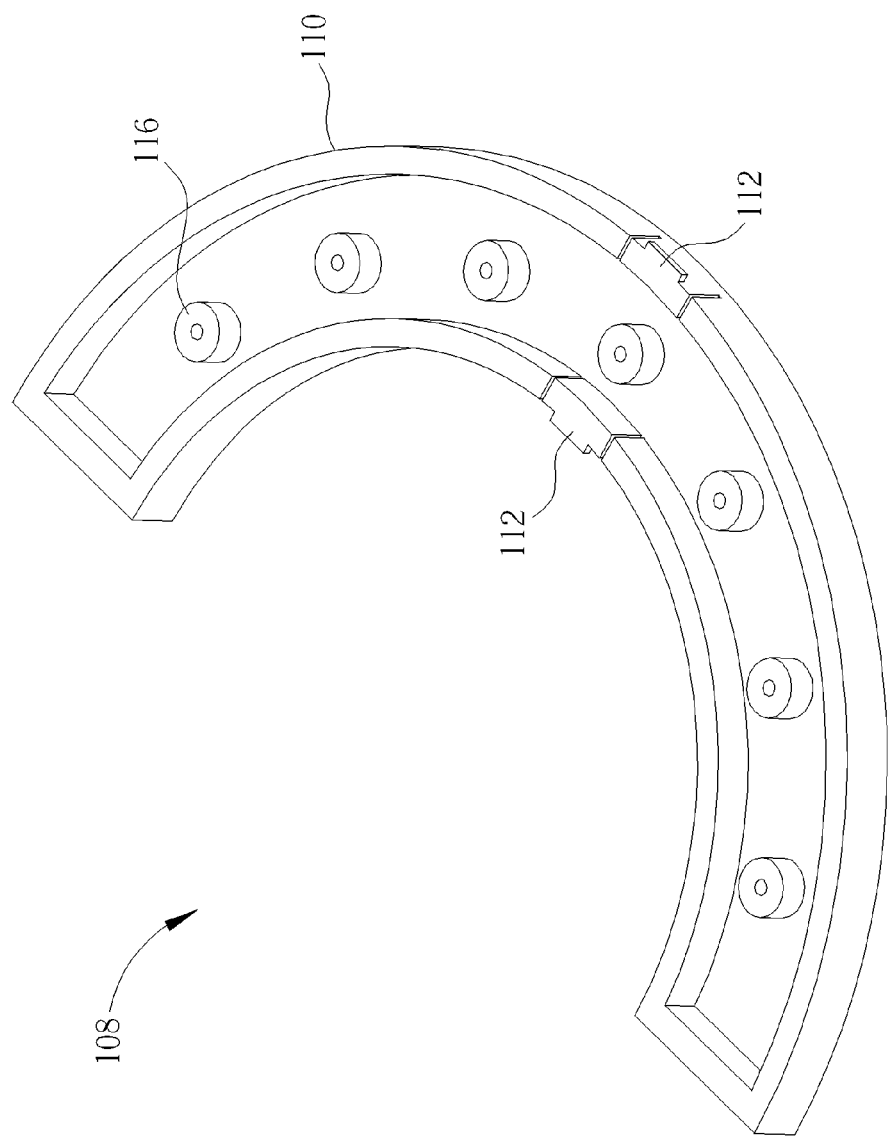
FIG. 13 is a diagram of the airflow guiding device according to the third embodiment of the present invention.

Please refer FIG. 8 to FIG. 12. FIG. 8 is a diagram of a thermal module 100 in an airflow guiding condition according to a third embodiment of the present invention. FIG. 9 is a sectional view of the thermal module 100 in the airflow guiding condition according to the third embodiment of the present invention. FIG. 10 is a diagram of the thermal module 100 in a non airflow guiding condition according to the third embodiment of the present invention. FIG. 11 is a sectional view of the thermal module 100 in the non airflow guiding condition according to the third embodiment of the present invention. FIG. 12 is an exploded drawing of the thermal module 100 according to the third embodiment of the present invention. The thermal module 100 includes a fan device 102 having a fan housing 104 for covering a fan, which is not shown in figures for displaying other components clearly. A slot 1041 is formed on the fan housing 104, and the slot 1041 can be an arc groove. Two positioning holes 106 are formed on both sides of the slot 1041 respectively. The thermal module 100 further includes an airflow guiding device 108. The difference between the third embodiment, the first embodiment, and the second embodiment is that the airflow guiding device 108 is installed on the fan housing 104 in a protrudable manner. When there is a need to utilize the airflow guiding device 108, the airflow guiding device 108 can protrude from the fan housing 104; and when there is no need to utilize the airflow guiding device 108, the airflow guiding device 108 can be contained in the fan housing 104. Please refer to FIG. 8 to FIG. 13. FIG. 13 is a diagram of the airflow guiding device 108 according to the third embodiment of the present invention. The airflow guiding device 108 includes a protruding component 110 installed inside the slot 1041 in a protrudable manner. The protruding component 110 can be an arc structure and a baffle. Two positioning components 112 are disposed on both sides of the protruding component 110 respectively corresponding to the positioning holes 106 for inserting into the positioning holes 106 so as to fix the protruding component 110 in the slot 1041. A plurality of pins 114 is formed on the slot 1041, and a plurality of pillars 116 is disposed on the protruding component 110 corresponding to the plurality of pins 114 respectively. The airflow guiding device 108 further includes a plurality of elastic components 118 for sheathing the pins 114 and installed inside the pillars 116 respectively. The elastic component 118 is for providing elastic force to the protruding component 110. The elastic component 118 can be a spring. The amount and the disposition of the positioning holes 106, the positioning components 112, the pins 114, the pillars 116, and the elastic components 118 are not limited to this embodiment and can be designed according actual demand.

When the user presses the protruding component 110 downward from the position as shown in FIG. 8 and FIG. 9 to the position as shown in FIG. 10 and FIG. 11, the positioning components 112 on the protruding component 110 insert into the lower positioning holes 106 and the elastic components 118 are compressed. As shown in FIG. 10, the protruding component 110 is contained in the fan housing 104, and the thermal module 100 can not provide airflow guiding function. When the user pulls the protruding component 110 upward from the position as shown in FIG. 10 and FIG. 11 to the position as shown in FIG. 8 and FIG. 9, the elastic components 118 are not compressed anymore and provide elastic force to the protruding component 110 for lifting the protruding component 110 so that the positioning components 112 on the protruding component 110 insert into the higher positioning holes 106 respectively. As shown in FIG. 8, the protruding component 110 protrudes from the fan housing 104 so that the thermal module 100 can provide airflow guiding function. The principle of guiding airflow of the third embodiment is the same as the one of the previous embodiment, and the detailed description is omitted herein.

Figure 14:
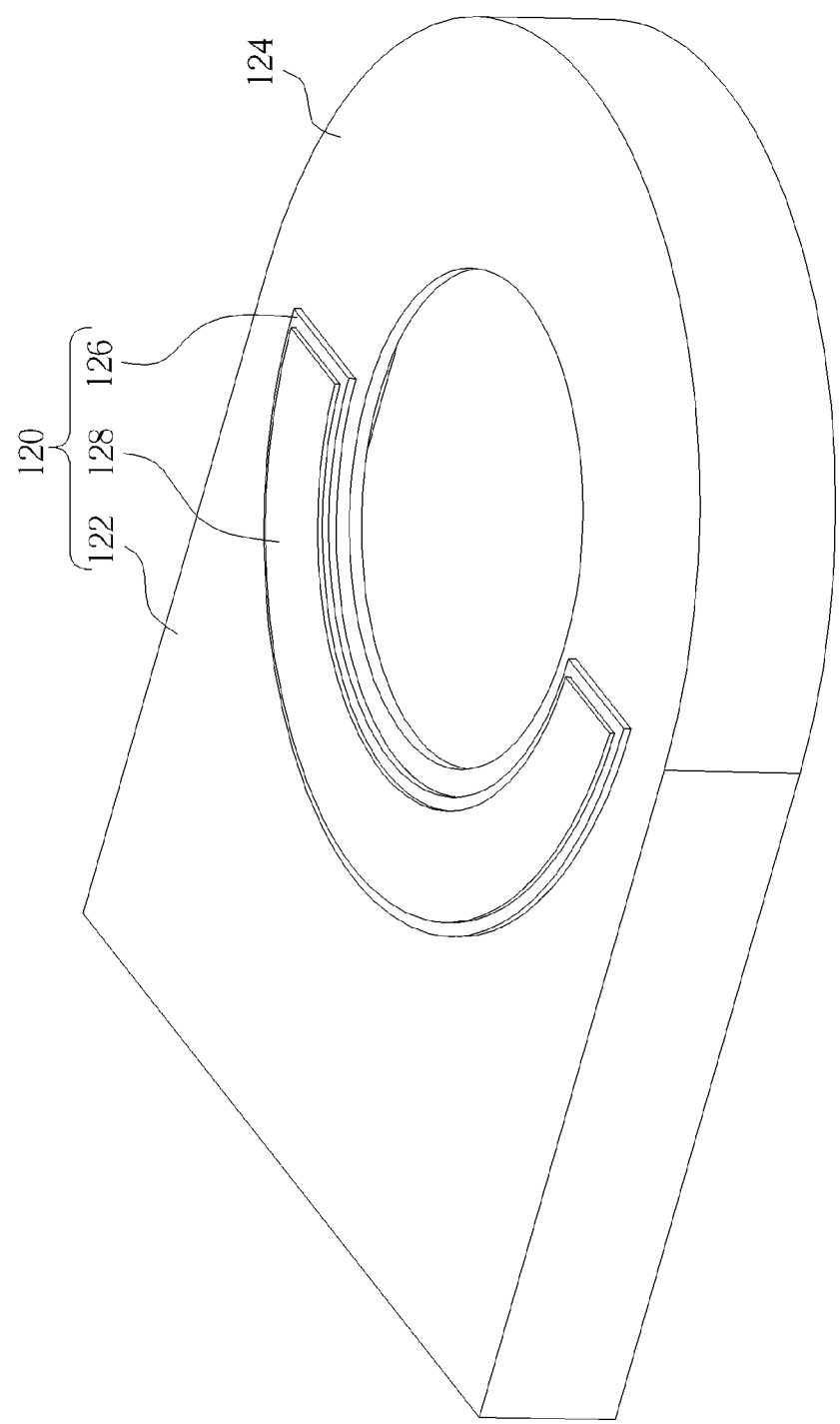
FIG. 14 is a diagram of a thermal module according to a fourth embodiment of the present invention.
Figure 15:
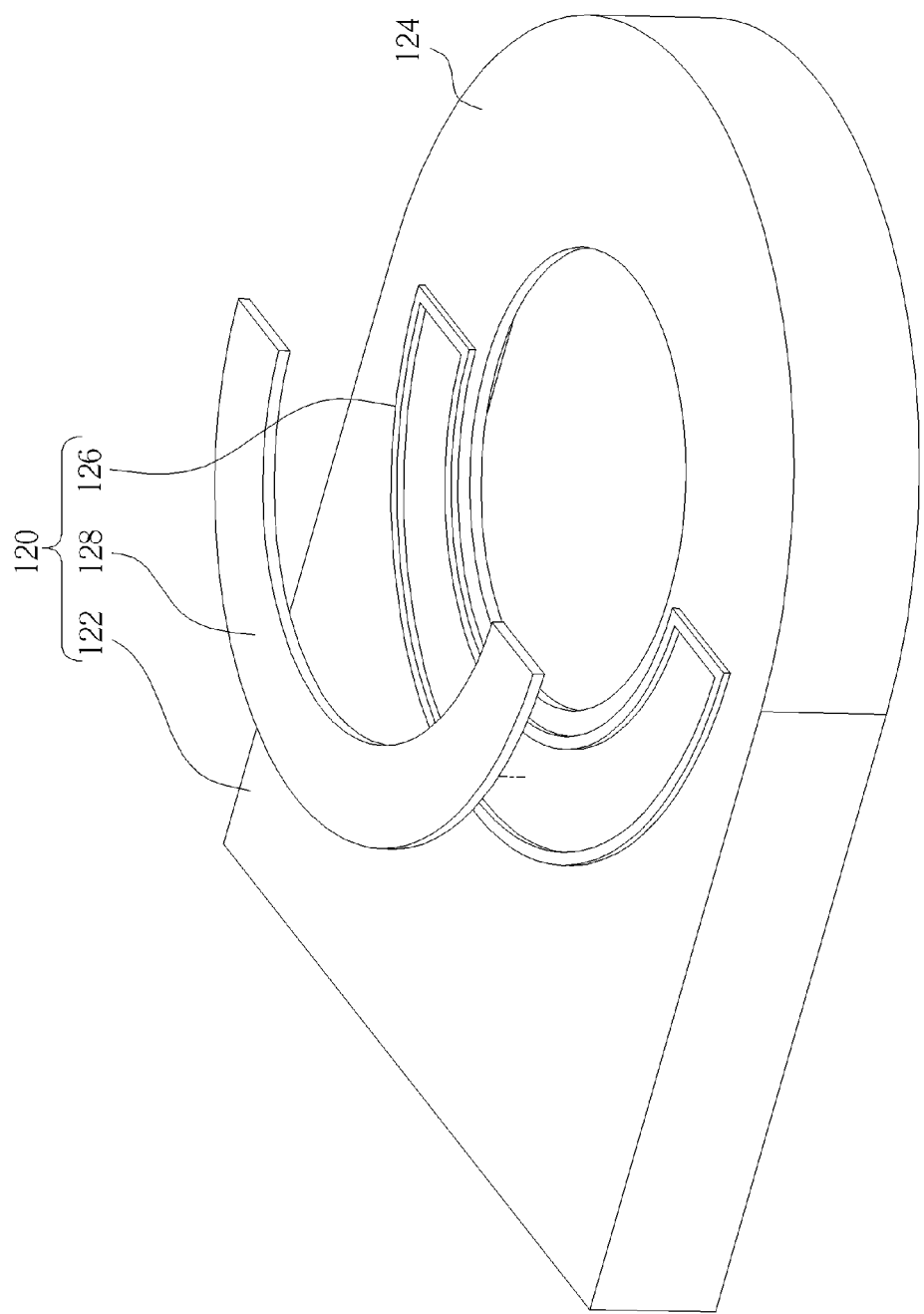
FIG. 15 is an exploded drawing of the thermal module according to the fourth embodiment of the present invention.

Please refer to FIG. 14 and FIG. 15. FIG. 14 is a diagram of a thermal module 120 according to a fourth embodiment of the present invention. FIG. 15 is an exploded drawing of the thermal module 120 according to the fourth embodiment of the present invention. The thermal module 120 includes a fan device 122 having a fan housing 124 for covering a fan, which is not shown in figures for displaying other components clearly. The thermal module 120 further includes an airflow guiding device 126 installed on the fan housing 124. The airflow guiding device 126 can be an arc structure and a baffle. The airflow guiding device 126 can be integrated with the fan housing 124 monolithically or be glued to the fan housing 124. The difference between the fourth embodiment and the first embodiment is that the thermal module 120 further includes an elastic pad 128 installed on a side of the airflow guiding device 126, such as being glued to the airflow guiding device 126. The elastic pad 128 can be made of rubber material. The interference of the elastic pad 128 and the second casing 56 in FIG. 2 can make the thermal module 120 contact with the motherboard or the upper casing more tightly for preventing the airflow from passing through the airflow guiding device 126. The elastic pad 128 also can be applied for the previous embodiments, and the detailed description is omitted herein.

In contrast with the prior art, the present invention provides the thermal module with airflow guiding function for guiding the hot air from the heat source into the fan so as to increase heat-dissipating efficiency. The arc structure of the airflow guiding device can be oriented according to the position of the heat source and cooperates with conventional airflow guiding mechanism together for dissipating heat outside smoothly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A thermal module comprising:
a fan device comprising:
a fan; and
a fan housing for covering the fan, a vent being disposed on the fan housing, a slot being formed on the fan housing, and at least one pin being formed on the slot; and
an airflow guiding device installed on the fan housing in a protrudable manner and disposed on a side of the vent for guiding airflow into the vent,
the airflow guiding device comprising:
a protruding component installed inside the slot in the protrudable manner, wherein
at least one elastic component connected to the protruding component for providing elastic force to the protruding component; and
at least one pillar is disposed on the protruding component corresponding to the pin, and the elastic component sheathes the pin and is installed inside the pillar.

2. The thermal module of claim 1, wherein the airflow guiding device is an arc structure.

3. The thermal module of claim 1, wherein at least one positioning hole is formed on a side of the slot, and a positioning component is disposed on the protruding component corresponding to the positioning hole for inserting into the positioning hole so as to fix the protruding component in the slot.

4. The thermal module of claim 1, wherein the slot is an arc slot and the protruding component is an arc structure.

5. The thermal module of claim 1, wherein the elastic component is a spring.

6. The thermal module of claim 1, further comprising an elastic pad installed on a side of the airflow guiding device.

7. The thermal module of claim 6, wherein the elastic pad is made of rubber material.

* * * * *